(12) United States Patent
Teggatz et al.

(10) Patent No.: US 8,664,745 B2
(45) Date of Patent: Mar. 4, 2014

(54) INTEGRATED INDUCTOR

(75) Inventors: Ross Teggatz, McKinney, TX (US); Wayne Chen, Plano, TX (US); Brett Smith, McKinney, TX (US)

(73) Assignee: Triune IP LLC, Richardson, TX (US)

( * ) Notice: Subject to any disclaimer, the term of this patent is extended or adjusted under 35 U.S.C. 154(b) by 0 days.

(21) Appl. No.: 13/187,403

(22) Filed: Jul. 20, 2011

(65) Prior Publication Data

US 2012/0038025 A1 Feb. 16, 2012

Related U.S. Application Data

(60) Provisional application No. 61/365,974, filed on Jul. 20, 2010.

(51) Int. Cl.
- *H01L 23/14* (2006.01)
- *H01L 23/29* (2006.01)
- *H01L 23/495* (2006.01)

(52) U.S. Cl.
USPC ............... 257/531; 257/677; 257/E23.053

(58) Field of Classification Search
USPC ............ 257/531, E23.053, E23.054; 29/827; 174/536–540; 361/813; 438/106–127
See application file for complete search history.

(56) References Cited

U.S. PATENT DOCUMENTS

| | | | | |
|---|---|---|---|---|
| 5,428,245 A | * | 6/1995 | Lin et al. | 257/666 |
| 5,909,050 A | * | 6/1999 | Furey et al. | 257/531 |
| 6,396,122 B1 | * | 5/2002 | Howard et al. | 257/531 |
| 6,492,708 B2 | * | 12/2002 | Acosta et al. | 257/531 |
| 7,061,359 B2 | * | 6/2006 | Ding et al. | 336/200 |
| 2007/0247268 A1 | * | 10/2007 | Oya et al. | 336/200 |
| 2008/0012103 A1 | * | 1/2008 | Foster et al. | 257/675 |
| 2009/0039999 A1 | * | 2/2009 | Fujii et al. | 336/200 |
| 2009/0160595 A1 | * | 6/2009 | Feng et al. | 336/200 |
| 2010/0102416 A1 | * | 4/2010 | Ashrafzadeh et al. | 257/531 |

\* cited by examiner

*Primary Examiner* — Steven J. Fulk
*Assistant Examiner* — Eric Ward
(74) *Attorney, Agent, or Firm* — Hovey Williams LLP

(57) ABSTRACT

The invention provides advances in the arts with useful and novel integrated packaging having inductor elements and adjacent magnetic material enhancing the inductance characteristics of the packaged inductor. Preferably the integrated packages also contain one or more ICs operable coupled to the inductor(s).

17 Claims, 3 Drawing Sheets

INTEGRATED INDUCTOR

PRIORITY ENTITLEMENT

This application is entitled to priority based on Provisional Patent Application Ser. No. 61/365,974 filed on Jul. 20, 2010, which is incorporated herein for all purposes by this reference. This application and the Provisional patent application have at least one common inventor.

TECHNICAL FIELD

The invention relates to integrated circuits (ICs) and packaging. More particularly, the invention relates to integrated semiconductor device packaging having one or more inductor elements and inductance-enhancing magnetic material encapsulated within the same package as one or more ICs.

BACKGROUND OF THE INVENTION

It is well known in the arts that it is often necessary to electrically couple passive components with integrated circuits (ICs) in order to make the ICs function in a given system. Such passive components include inductors and other elements, as well as their derivatives, such as transformers. The inclusion of separate passive components and ICs can lead to problems in the design and assembly of electronic apparatus. Using separate components, designers and assemblers must select and install the correct components for proper functioning. Printed circuit board (PCB) layout complexity may be increased due to the need to provide space for passive components such as inductors for use in conjunction with ICs. In some cases, the inclusion of passive components may be essential to the proper functioning of a particular component, with the result that the design and assembly processes require planning for the inclusion of two or more parts for simulation, design, purchasing, assembly, testing etc., instead of just one. Particularly in complex microelectronic systems, the increased part count can lead to higher costs and/or lower yields.

It would be desirable to integrate one or more inductor elements into a single package along with an IC. In many cases, PCB layout complexity would be reduced as fewer components and routes would be required on the board, and component count would be reduced, simplifying some steps in the design and development processes. To cite one example, implementing a system that includes a switched-mode power supply (SMPS) requires an inductor on the output to produce a regulated voltage. Including the appropriate inductor element in the same package with the SMPS would be an improvement. Additionally, it has been determined that the inclusion of magnetic material adjacent to an inductor coil can beneficially increase the inductance characteristics of a given inductor geometry. Due to the foregoing and other problems and potential advantages, improved integrated inductor designs and methods would be a useful contribution to the applicable arts.

SUMMARY OF THE INVENTION

In carrying out the principles of the present invention, in accordance with preferred embodiments, the invention provides advances in the arts with useful and novel integrated packaging having an inductor element included within a package containing one or more ICs. Preferably, the integrated inductor element according to the invention is constructed of materials adapted from those available in the practice of the applicable arts such as for example, leadframe materials, ferrite, and other magnetic materials such as sendust. Variations in the practice of the invention are possible and exemplary preferred embodiments are illustrated and described. All possible variations within the scope of the invention cannot, and need not, be shown. It should be understood that the invention may be used with various package and PCB layout formats.

According to one aspect of the invention, in an example of a preferred embodiment, a semiconductor device package includes an inductor with adjacent magnetic material whereby a magnetic field from the magnetic material acts to increase the inductance of the inductor. Encapsulant encloses both the inductor and magnetic material within a single semiconductor device package.

According to another aspect of the invention, a preferred embodiment of a semiconductor device package incorporates an integrated inductor having a coil of leadframe material.

According to another aspect of the invention, a preferred embodiment of a semiconductor device package incorporates an integrated inductor having a coil made from a printed circuit board trace.

According to another aspect of the invention, a preferred embodiment of a semiconductor device package incorporates an integrated inductor having adjacent powdered ferrite.

According to another aspect of the invention, a preferred embodiment of a semiconductor device package incorporates an integrated inductor having adjacent sendust.

According to another aspect of the invention, a preferred embodiment of a semiconductor device package incorporates more than one integrated inductor having adjacent magnetic material.

According to another aspect of the invention, a preferred embodiment of a method for manufacturing a semiconductor device package having an integrated inductor includes a step of partially forming a planar inductor from leadframe material. Magnetic material is affixed adjacent to the inductor. In preferred embodiments, an IC is coupled with the leadframe material. In a further step, a portion of the leadframe material and the IC are encapsulated to form the body of the semiconductor device package. The formation of the inductor is completed by the removal of additional leadframe material.

According to another aspect of the invention, a preferred embodiment of a method for manufacturing a semiconductor device package includes a further step of affixing magnetic material to the backside of the package subsequent to the removing step.

According to another aspect of the invention, a preferred embodiment of a method for manufacturing a semiconductor device package includes a further step of affixing a magnetic body in a coplanar with the inductor.

The invention has advantages including but not limited to providing one or more of the following features, conservation of board area, simplified design and layout, improved efficiency and reduced costs. These and other advantageous, features, and benefits of the invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the description and drawings in which.

References in the detailed description correspond to like references in the various drawings unless otherwise noted. Descriptive and directional terms used in the written description such as front, back, top, bottom, upper, side, et cetera, refer to the drawings themselves as laid out on the paper and not to physical limitations of the invention unless specifically noted. The drawings are not to scale, and some features of embodiments shown and discussed are simplified or amplified for illustrating principles and features as well as anticipated and unanticipated advantages of the invention.

DESCRIPTION OF PREFERRED EMBODIMENTS

Although the making and using of various specific exemplary embodiments of the invention are discussed herein, it should be appreciated that the systems and methods described and shown exemplify inventive concepts which can be embodied in a wide variety of specific contexts. It should be understood that the invention may be practiced in various applications and embodiments without altering the principles of the invention. For purposes of clarity, detailed descriptions of functions, components, and systems familiar to those skilled in the applicable arts are not included. In general, the invention provides semiconductor packages for ICs with one or more integrated inductor elements and associated magnetic material. The invention is described in the context of representative example embodiments. Although variations in the details of the embodiments are possible, each has advantages over the prior art.

Figure 1:
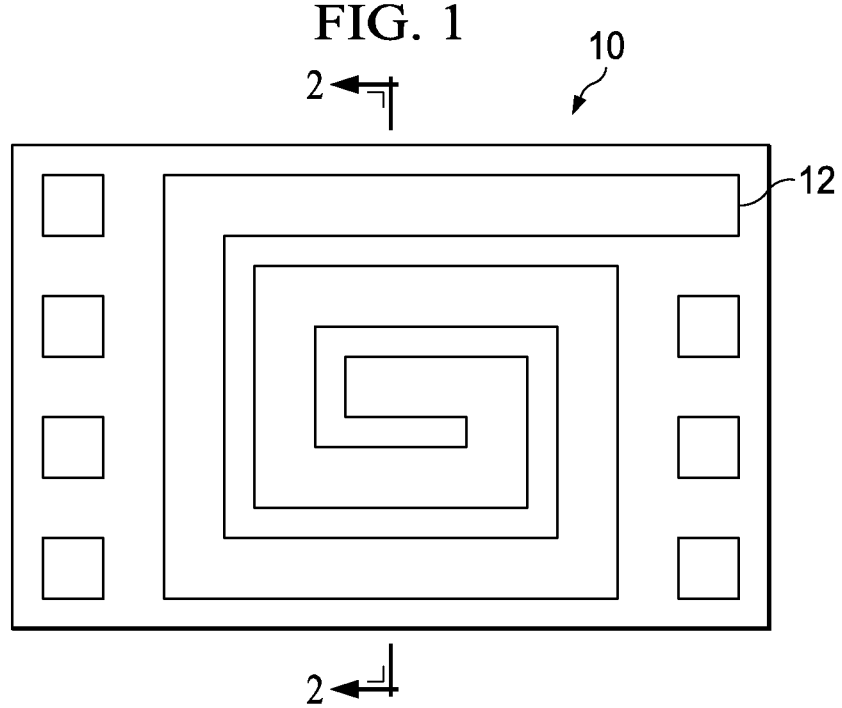
FIG. 1 is a bottom view of an example of a preferred embodiment of semiconductor packaging with an integrated inductor element.
Figure 2:
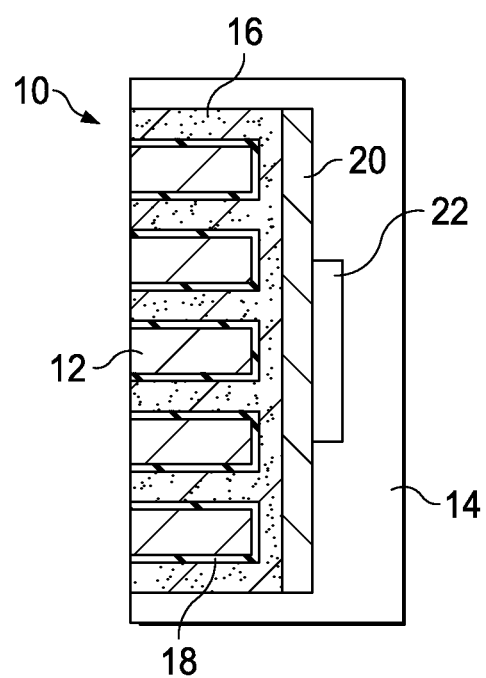
FIG. 2 is a cutaway side view of an example of a preferred embodiment of semiconductor packaging with an integrated inductor element.
Figure 3:
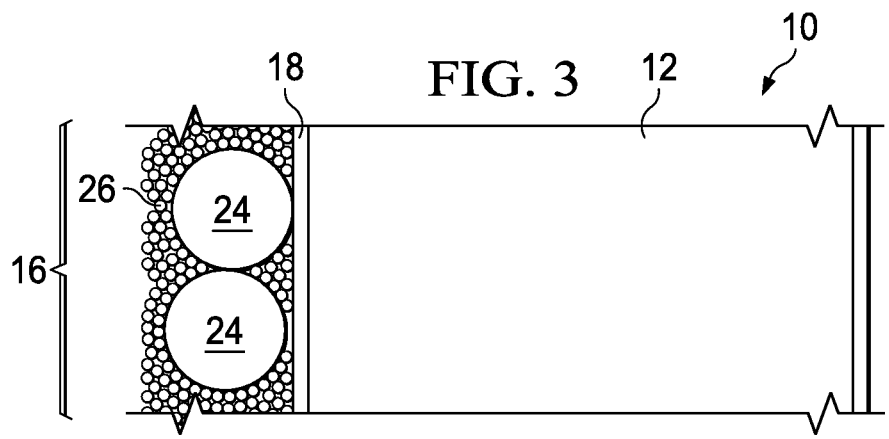
FIG. 3 is cutaway partial side view of an example of a preferred embodiment of a semiconductor package with an integrated inductor element.

Referring initially to FIGS. 1, 2 and 3, an example of a preferred embodiment of an integrated package 10 is illustrated. As shown in the backside view of FIG. 1, the package 10 has an inductor 12, preferably made from substantially planar leadframe material formed in a coil configuration. In FIG. 2, a corresponding cut-away side view, taken along line 2-2 of FIG. 1, is shown with encapsulant 14 in place. The leadframe material inductor 12 is adjacent to a magnetic material 16 possessing a magnetic field. The magnetic material 16 is preferably a magnetic alloy in a combination of elements containing at least one of three magnetic elements, iron (Fe), nickel (Ni), or cobalt (Co). An insulating material 18 is preferably provided to electrically isolate the inductor 12. The insulating material 18 is pervious to magnetic fields. Preferably, a magnetic body 20 is affixed adjacent to and/or coplanar with the inductor 12, further enhancing the magnetic field. One or more integrated circuit (IC) 22 is preferably included in the package 10 as shown. Additional electronic components may also be included within the package. Referring to FIG. 3, a cutaway partial side view depicts a portion of the package 10 in further detail. The coating of insulating material 18 insulates the leadframe material 12 from making unwanted electrical contact with the magnetic material 16. Preferably, the magnetic material may include sendust 24 and powdered ferrite 26, as shown, in a mixture which has been devised to provide an enhanced magnetic field. Sendust is a magnetic compound which includes iron, silicon and aluminum. Ferrite is a magnetic substance which includes ferric oxide combined with the oxides of one or more other metals such as manganese, nickel, or zinc. Ferrite and sendust are known for their high magnetic permeability and high electrical resistivity. Other magnetic materials with similar characteristics may also be used.

Figure 4A:
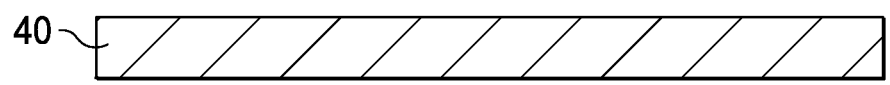
FIGS. 4A through 4G illustrate an exemplary preferred embodiment of a semiconductor package with an integrated inductor element and steps in a method of manufacturing the same.
Figure 4B:
Figure 4C:
Figure 4D:
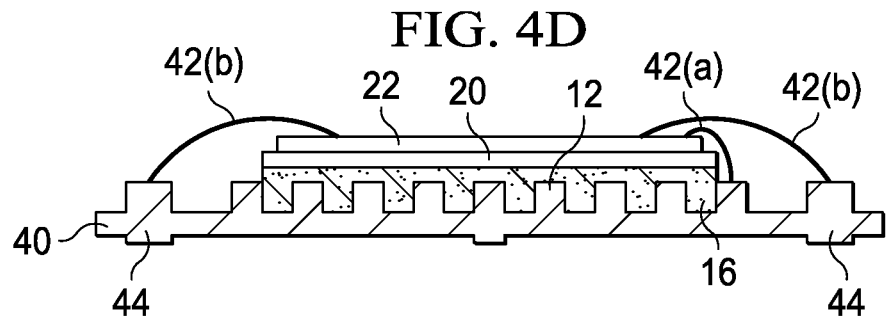
Figure 4E:
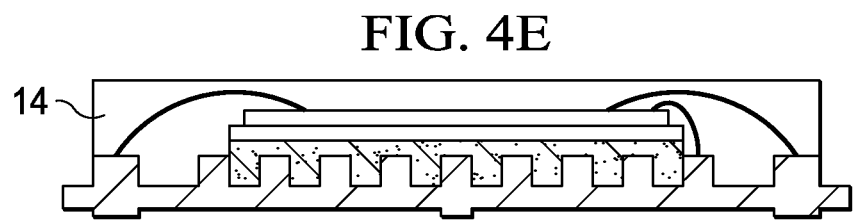
Figure 4F:
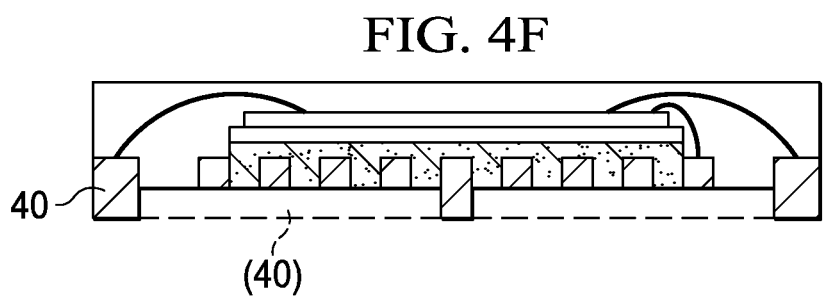
Figure 4G:
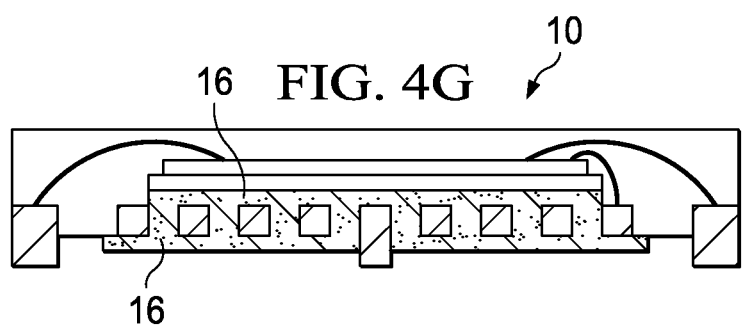

An example of steps in a process of assembling an integrated inductor system 10 according to the invention is shown sequentially in FIGS. 4A through 4G. As depicted in FIG. 4A, a leadframe material 40 is preferably provided. The leadframe material 40 may typically be a conventional conductive metal such as aluminum or aluminum alloy. The leadframe material 40 is etched, preferably using conventional manufacturing techniques, as shown in FIG. 4B to form the coils of an inductor 12, typically in the form of a generally planar coil. Magnetic material 16, shown added in FIG. 4C, is preferably placed adjacent to the coils of the inductor 12. The magnetic material 16 acts to increase the inductance of the inductor 12 beyond the inductance characteristic otherwise achievable using the coil configuration alone. The magnetic field used to enhance the inductance level may be further enhanced by the inclusion of an additional magnetic body 20 in close proximity with the plane of the inductor 12, as shown in FIG. 4D. The magnetic body 20 is preferably a single piece of magnetic alloy configured for placement adjacent to and preferably coplanar with the inductor 12. In this example, the magnetic body 20 is placed in direct contact with the magnetic material 16 formed around the inductor 12. An IC device 22 is typically included in the integrated inductor system, 10, preferably mounted on a magnetic body 20 as shown, directly on the magnetic material 16 in the case where the magnetic body is omitted, or optionally, on a nonmagnetic body such as a die paddle made from leadframe material (not shown). Additional ICs and/or other electronic components may also be included in a similar manner without departure from the invention. Generally, bond wires 42 and/or other electrical connections, e.g. pad or through-silicon via connections (not shown), are completed as needed in order to make the system 10 operable. For example, electrical connections may be made between the inductor 12 and the IC 22 as shown at bond wire 42a to provide for their interoperability, and additional electrical connections may be made, as shown at bond wires 42b to provide for system 10 input and output pins or pads 44, coil taps and/or other connections. As shown in FIG. 4E, the system 10 is encapsulated 14 in order to protect an isolate the internal components. The back side surface of the leadframe material 40 is etched, machined, ablated, and/or polished away to complete the formation of the inductor coil 12, FIG. 4F. Preferably, as shown in FIG. 4G, additional magnetic material 16 may be added adjacent to the inductor 12. Those skilled in the arts should appreciate that inductors constructed as described may be used to assemble a package containing a transformer. Such an assembly incorporates one or more integrated inductors and possible additional integrated componentry with a structure similar to that described and shown for single inductors.

The systems and methods of the invention provide one or more advantages including but not limited to, conservation of board area, simplified design and implementation processes, reduced errors, and reduced costs. While the invention has been described with reference to certain illustrative embodiments, those described herein are not intended to be construed in a limiting sense. For example, variations or combinations of steps or materials in the embodiments shown and described may be used in particular cases without departure from the invention. Although the presently preferred embodiments are described herein in terms of particular examples, modifications and combinations of the illustrative embodiments as well as other advantages and embodiments of the invention will be apparent to persons skilled in the arts upon reference to the drawings, description, and claims.

We claim:

1. A semiconductor device package comprising:
an inductor with a plurality of connected segments, each segment including a first side surface, a spaced-apart opposing second side surface, a top surface positioned at upper edges of the first side surface and the second side surface, and a bottom surface positioned at lower edges of the first side surface and the second side surface;
an electrically insulating material in contact with the first side surface, the second side surface, the bottom surface, and the top surface of at least a portion of the segments of the inductor;
a magnetic material in contact with the electrically insulating material and surrounding the first side surface, the second side surface, the bottom surface, and the top surface of at least a portion of the segments of the inductor having one or more magnetic field, whereby the one or more magnetic field acts to increase the inductance of the inductor and wherein the magnetic material includes a top surface spaced apart from the top surface of the segments of the inductor;
a magnetic body coupled to the top surface of the magnetic material; and
an encapsulant encapsulating the inductor, the magnetic material, and the magnetic body within a single semiconductor device package.

2. The semiconductor device package according to claim 1 wherein the inductor further comprises leadframe material.

3. The semiconductor device package according to claim 1 wherein the inductor further comprises a printed circuit board trace.

4. The semiconductor device package according to claim 1 wherein the magnetic material further comprises a magnetic alloy having one or more of, iron, nickel, cobalt.

5. The semiconductor device package according to claim 1 wherein the magnetic material further comprises powdered ferrite.

6. The semiconductor device package according to claim 1 wherein the magnetic material further comprises sendust.

7. The semiconductor device package according to claim 1 wherein the magnetic material further comprises a combination of ferrite and sendust.

8. The semiconductor device package according to claim 1 wherein the magnetic material further comprises alnico.

9. The semiconductor device package according to claim 1 wherein the magnetic material further comprises permalloy.

10. The semiconductor device package according to claim 1 further comprising an integrated circuit operably coupled to the inductor and encapsulated within the package.

11. The semiconductor device package according to claim 1 wherein the inductor is substantially planar.

12. The semiconductor device package according to claim 1 further comprising one or more additional integrated passive component operably coupled to the inductor.

13. The semiconductor device package according to claim 1, further comprising an integrated circuit coupled to a top surface of the magnetic body.

14. The semiconductor device package according to claim 1, wherein the inductor further includes a first end at an outer edge of the semiconductor device package configured to receive a wire bond.

15. The semiconductor device package according to claim 14, wherein the first end of inductor is wire bonded to a pad of an integrated circuit coupled to a top surface of the magnetic body.

16. The semiconductor device package according to claim 1, wherein the segments along an outer edge of the inductor have only the bottom surface and the first side surface covered with magnetic material.

17. The semiconductor device package according to claim 1, wherein first and second opposing edges of the magnetic body are aligned with first and second opposing edges of the magnetic material.

* * * * *